United States Patent [19]
Yonemitsu et al.

[11] Patent Number: 5,745,505
[45] Date of Patent: Apr. 28, 1998

[54] DIGITAL SIGNAL ENCODING METHOD AND APPARATUS, DIGITAL SIGNAL RECORDING MEDIUM, AND DIGITAL SIGNAL DECODING METHOD AND APPARATUS

[75] Inventors: Jun Yonemitsu, Kanagawa; Ryuichi Iwamura, Tokyo; Yasushi Fujinami, Kanagawa; Katsuji Igarashi, Tokyo; Yoshiyuki Akiyama, Kanagawa, all of Japan

[73] Assignee: Sony Corporation, Tokyo, Japan

[21] Appl. No.: 530,303

[22] PCT Filed: Feb. 28, 1995

[86] PCT No.: PCT/JP95/00305

§ 371 Date: Mar. 1, 1996

§ 102(e) Date: Mar. 1, 1996

[87] PCT Pub. No.: WO95/24037

PCT Pub. Date: Sep. 8, 1995

[30] Foreign Application Priority Data

Mar. 1, 1994 [JP] Japan ..................... 6-056680
Mar. 19, 1994 [JP] Japan ..................... 6-074445

[51] Int. Cl.$^6$ .................. G11B 20/18; H03M 13/00
[52] U.S. Cl. .................. 371/37.4; 371/40.14
[58] Field of Search ................. 371/37.4, 37.5, 371/40.1, 40.14

[56] References Cited

U.S. PATENT DOCUMENTS

| | | | |
|---|---|---|---|
| 4,356,564 | 10/1982 | Doi et al. | 371/37.4 |
| 4,451,920 | 5/1984 | Hoshimi et al. | 371/37.4 |
| 4,598,403 | 7/1986 | Odaka | 371/37.5 |
| 5,060,221 | 10/1991 | Sako et al. | 369/59 |

FOREIGN PATENT DOCUMENTS

| | | |
|---|---|---|
| 60-143485 | 7/1985 | Japan . |
| 60-143486 | 7/1985 | Japan . |
| 61-182676 | 8/1986 | Japan . |
| 4-339368 | 11/1992 | Japan . |
| 6-1605 | 1/1994 | Japan . |

Primary Examiner—Stephen M. Baker
Attorney, Agent, or Firm—Frommer Lawrence & Haug LLP; William S. Frommer

[57] ABSTRACT

The present invention provides digital signal encoding method and apparatus, a digital signal recording medium, and digital signal decoding method and apparatus which improve error correcting capabilities and reduce redundancy with a simple structure when the digital signal is encoded and decoded by adding an error correction code. By increasing the code length, the correction parity number, and the interleave constraint length more than the compact disc standard when the digital signal is encoded by adding an error correction code, the redundancy can be reduced and the size of data that can be recorded can be increased.

45 Claims, 16 Drawing Sheets

2

DIGITAL SIGNAL ENCODING METHOD AND APPARATUS, DIGITAL SIGNAL RECORDING MEDIUM, AND DIGITAL SIGNAL DECODING METHOD AND APPARATUS

TECHNICAL FIELD

The present invention relates to a digital signal encoding method and apparatus, a digital signal recording medium, and a digital signal decoding method and apparatus, and is applicable to an apparatus for encoding and decoding a digital signal by adding an error correction code.

BACKGROUND ART

Heretofore, in a compact disc (CD), an audio signal is converted into a digital signal so that the signal is encoded and recorded in accordance with a CD standard. A signal format of the CD is shown in FIG. 14. One frame comprises one byte long subcode, 24 bytes long actual data, and 4 bytes long C1 error correction code and 4 bytes long C2 error correction code (CIRC (Cross Interleave Reed-Solomon Code)) which amount to a total of 33 bytes. In addition, at the head of the one frame, a frame synchronization signal is added. Consequently, a ratio of the error correction codes which occupies in the total size of data excluding subcodes, namely the redundancy is 8 bytes/32 bytes, or 25%.

In addition, in the case of a signal format of the CD, as shown in FIG. 15, one block is formed of 98 frames which is called one sector. Actual data in this one sector is 2352 bytes long. In the two frames long subcode at the head of the one sector, peculiar patterns referred to as S0 and S1 are recorded so that the head of the sector can be differentiated. Incidentally, the error correction code CIRC is what connects two stages of Reed Solomon Codes, namely C1 and C2 codes with the interleave.

A structure of this CD encoding/decoding apparatus is shown in FIG. 16. At the outset, in the encoding apparatus, six samples portion of each channel L and R, or 24 bytes constitutes one unit of the digital audio data so that the data is input to the CIRC encoding circuit 1. The CIRC encoding circuit 1 comprises a circuit shown in FIG. 17. More specifically, an even number sample delay circuit 21 and a scramble circuit 22 delays by two frame portions even-numbered sample data respectively to change the arrangement thereof. This is intended to interpolate defect portion that cannot be corrected with adjacent data and to obscure the data in acoustic sense when the error cannot be corrected.

Furthermore, C2 code encoding portion 23 calculates 4 bytes of C2 parity to be added to the 24 bytes of the original code. The interleaver 24 offers interleaves whose maximum delay extends over 108 frames. The C1 code encoding portion 25 calculates 4 bytes long C1 parity to be added to 28 bytes long data including the original code and C2 parity, so that the total length of data becomes 32 bytes.

The odd number symbol delay circuit 26 delays by another one frame portion only the odd-numbered symbol. The reason for such a delay is that when a random error is generated over 2 bytes the effect is given to only one symbol in one series of C1 codes. The inverter 27 inverts a polarity of the parity to prevent a judgement that no error is generated when an error in all the data becomes zero.

A subcode adding circuit 2 adds one byte long subcode to a CIRC encoding output thus obtained for each of 32 bytes. Here, above-described codes S0 and S1 indicating the head of the sector are also added as the subcodes. And the codes are EFM modulated with the subsequent EFM (Eight Fourteen Modulation) modulating circuit 3, and a frame synchronization signal is added to a head of the frame in the frame synchronization signal adding circuit 4 to be sent to a cutting apparatus 5. The cutting apparatus 5 performs mastering so that a disc 6 in which a digital audio signal is recorded in accordance with the CD standard is manufactured.

On the other hand, the decoding apparatus performs a process which is opposite to the encoding process for decoding the signals. More specifically, the signal read from the disc 6 is separated with a frame synchronization detecting and separating circuit 8 via an RF amplifier 7 with the detection of the frame synchronization signal. Subsequently, the EFM demodulation circuit 9 demodulates the signal, and the subcode detecting and separating circuit 10 detects and separates the subcode at the head of the one frame to be input to the CIRC decoding circuit 11. The subcode detecting and separating circuit 10 differentiates the head of the sector by detecting the codes S0 and S1. This CIRC decoding circuit 11 comprises a circuit shown in FIG. 18 so that one frame portion of 32 bytes are input.

More specifically, an even number symbol delay circuit 31 delays by one frame even-numbered symbol out of the 32 bytes. The subsequent parity inverting circuit 32 inverts the parity. The C1 code decoding circuit 33 uses a C1 code to correct an error. This allows 28 bytes long data excluding C1 parity to be sent to the subsequent deinterleaver 34 to be deinterleaved. The C2 code decoding portion 35 uses the C2 code to correct an error. This allows 24 bytes excluding C2 parity to be sent to the subsequent descramble circuit 36 to be descrambled. The odd number sample delay circuit 37 delays by two frame portion odd-numbered sample of the descrambled data thereby outputting one frame portion of 24 bytes long data.

Here, relations between the C1 code series, C2 code series, and data actually recorded on the disc is explained by using FIGS. 18 and 19. A horizontal direction in FIG. 19 is a C1 code series in which an error is corrected with the C1 code in this order. Assuming that data is recorded on the actual data in the order of D0, D1 and D2, at the outset D0, D1, D2 . . . data is input in parallel to the even number symbol delay circuit 31. In the even number symbol delay circuit 31, since even-numbered symbols such as D1, D3, D5 . . . are delayed by one frame, at the entrance of the C1 code decoding portion 33 at the certain time, one frame portion of symbols in the C1 code series shown in the horizontal direction in FIG. 19 for example, D32, D1, D34, D3 . . . D29, D62 and D31 are input in parallel. Consequently, relations between data read out from the disc and the C1 code series exhibit a zigzag shape as shown in FIG. 19. The relations will be as follows when the relations is represented in an equation. Let "i" designate a C1 code series number, "j" a symbol number in the C1 code. Let "k" designate a symbol order recorded on the disc. Then the symbol is designated by "Dk". Then (i, j) can be represented in the following equations:

$$i = (k/32) + (k \bmod 2)$$

$$j = K \bmod 32 \quad (1)$$

However, the fractions less than a decimal point are rounded down in division. In addition, symbol "mod" in the aforementioned equations designate a surplus in the division. These definitions are the same with the following equations.

On the other hand, in the deinterleaver 34, since an output from the C1 code decoding portion 33 is delayed by 108 frames at most, at the entrance of the C2 code decoding portion 35 a symbol series taken out by one symbol for every four series of C1 code series is input as a C2 code series as shown in FIG. 19 with the dotted arrow. Consequently, when an error is corrected by using the C2 code, symbols in 108 frame portions in the C1 code series from the disc must be read out. Incidentally, in the present application, C1 code series frame which is required for the error correction in the C2 code series is referred to as an interleave constraint length. With the CD, the interleave constraint length has 108 frames.

By the way, as described above, the CIRC used in the CD is an error correction code which is effective for both a random error and burst error. However, the correction capability is limited. When the digital signal is to be recorded in high density, it often happens that the error cannot be corrected. In addition, when a larger size of data is to be recorded on the disc, the ratio of error correction code which occupies the total size of data, or the redundancy is already determined. Thus the size of data that can be recorded is limited.

Furthermore, in the CD standard, no information is available which differentiates the order of frames. Thus, there is a problem in which when a certain frame cannot be read out connectively due to a burst error, no method is available which allows detecting the number of defected frames with the result that the C2 code cannot be corrected and correction cannot be performed at all.

DISCLOSURE OF INVENTION

The present invention has been made in view of the aforementioned point, and the invention is intended to provide digital signal encoding method and apparatus, a digital signal recording medium, and digital signal decoding method and apparatus which are capable of improving error correction capabilities and reducing the redundancy with a simple structure when a digital signal is encoded and decoded by adding an error correction code.

To solve such a problem, according to the present invention, a digital signal encoding method for encoding a digital signal by adding an error correction code comprises: adding to an input digital signal a first parity obtained by using at least a first encoding series of the input digital signal; adding to the input digital signal a second parity obtained by using a second code series which corresponds to a plurality of symbols taken out from the adjacent plurality of first code series by shifting each symbol by one symbol; and arranging an input digital signal to which the first and the second parity are added so that an arrangement of symbols in the second code series does not agree with the arrangement of symbols on a recording medium.

Furthermore, according to the present invention, a digital signal encoding apparatus for encoding a digital signal by adding an error correction code comprises: means for adding to an input digital signal a first parity obtained by using at least a first code series of an input digital signal; means for adding to an input digital signal a second parity obtained by using a second code series which corresponds to a plurality of symbols taken out from the aforementioned plurality of adjacent first code series by shifting each symbol by one symbol and means for arranging the input digital signal to which the first and the second parity are added so that the arrangement of symbols in the second code series does not agree with the arrangement of symbols on a recording medium.

Furthermore, according to the present invention, in a digital signal recording medium recorded an encoding digital signal encoded by adding an error correction code, the encoding digital signal is generated by adding to an input digital signal a first parity obtained by using at least a first code series of input digital signal and then adding to the input digital signal a second parity obtained by using a second code series which corresponds to the plurality of symbols taken out from the plurality of adjacent first code series by shifting each symbols by one symbol thereby arranging the input digital signal to which the first and the second parity are added so that the arrangement of symbols in the second code series does not agree with the arrangement of symbols on a digital signal recording medium.

Furthermore, according to the present invention, in a digital signal decoding method for decoding an encoding digital signal generated by adding to the input digital signal the first parity obtained by using at least the first code series of the input digital signal, adding to the input digital signal the second parity obtained by using the second code series which corresponds to the plurality of symbols taken out from the plurality of adjacent first code series by shifting each the symbols by one symbol thereby arranging an input digital signal to which the first and the second parity are added so that the arrangement of symbols in the second code series does not agree with the arrangement of symbols on the recording medium, an encoding digital signal supplied from the transmission channel are rearranged, the encoding digital signal thus rearranged is subjected to a first error correction in the direction of the first code series by using the first parity, and the encoding digital signal thus rearranged is subjected to the second error correction in the direction of the second code series by using the second parity.

Furthermore, according to the present invention, a digital signal decoding apparatus for decoding an encoding digital signal generated by adding to the input digital signal the first parity obtained by using at least the first code series of the input digital signal, adding to the input digital signal the second parity obtained by using the second code series which corresponds to the plurality of symbols taken out from the plurality of adjacent first code series by shifting each symbols by one symbol thereby arranging an input digital signal to which the first and the second parity are added so that the arrangement of symbols in the second code series does not agree with the arrangement of symbols on the recording medium, comprises: means for rearranging an encoding digital signal supplied from a transmission channel; means for subjecting thus rearranged encoding digital signal to the first error correction in the direction of the first code series by using the first parity; and means for subjecting the rearranged encoding digital signal to the second error correction in the direction of the second code series by using the second parity.

When the digital signal is encoded by adding an error correction code, the code length, the correction parity number and the interleave constraint length are increased to a level more than the compact disc standard. Consequently, the redundancy is reduced compared with the compact disc standard to increase a size of data that can be recorded, so that an error correction capabilities can be improved with a simple structure and the redundancy can be eliminated when the digital signal is encoded and decoded by adding an error correction code.

BEST MODE FOR CARRYING OUT THE INVENTION

An object of the interleave will be explained at the outset before describing an embodiment of the present invention. The interleave serves to distribute burst errors that continue over several symbols on a disc so that the burst errors can be observed as random errors in a direction of C2. By the way, in the present embodiment as described later, the length of the C1 code series is set to 136 symbols which is considerably long compared with 32 symbols of a CD. Since the CD is short with a 32 symbols of C1 code series, symbols are taken out for every four frames of C1 code series to be a C2 code series as described above to attain the aforementioned object. Thus, when the C1 code series is arranged in the horizontal direction, an angle formed by the C1 code series and the C2 code series is referred to as a deep interleave when the angle is large. In the present embodiment, since the C1 code series is long, the aforementioned object can be attained without performing the deep interleave.

Figure 19:
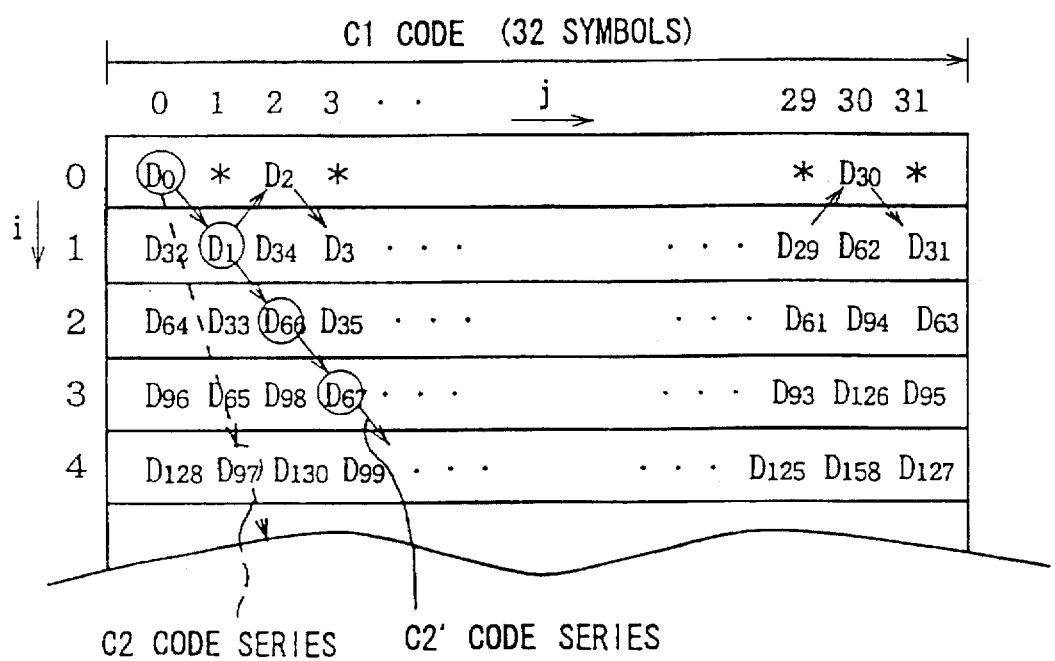
FIG. 19 is a schematic diagram showing a recording order on the disc and the order of the C1 code in the conventional compact disc.

In the beginning, the interleave in CIRC used in the CD is rendered simply shallow. Then it is thought that the C2 code series constitutes a C2' code series shown in FIG. 19. In this case, the C2' code series is an interleave such that 33 symbols are inserted between adjacent symbols with D0 being disposed at the head thereof as shown in FIG. 19. With such a structure, one symbol is taken out from each of consecutive C1 code series. In the embodiment shown hereinbelow, since the C1 code series is long, a space between each of the symbols in the C2' code series is actually longer than this, the aforementioned object can be attained like the deep interleave of the CD.

When such an interleave is performed, D0 and D1, and D66 and D67 or the like become symbols which are located adjacent to each other on the C2' code series and arranged adjacent to each other on the disc, too. The same thing can be said even when the C1 code series is long. The original object of the interleave is to distribute errors that continue over several symbols on the C2 code series. Thus it is not preferable that a symbol order on the disc agrees with a symbol order on the C2' code with the result that the correction capabilities of the C2' code get worse. In embodiments that will be described hereinafter, the symbol order on the disc does not agree with the symbol order on the C2' code.

One embodiment of the present invention will be described in detail with respect to the drawings hereinbelow.

(1) Method for Encoding a Digital Signal

In a method for encoding a digital signal according to the present embodiment, a format in which the interleave constraint length is lengthened and a burst error correction capability is improved is referred to as an L format whereas a format in which the constraint length is shortened and the burst error correction capability is minimized to a required degree to raise a process speed is referred to as an S format.

Figure 1:
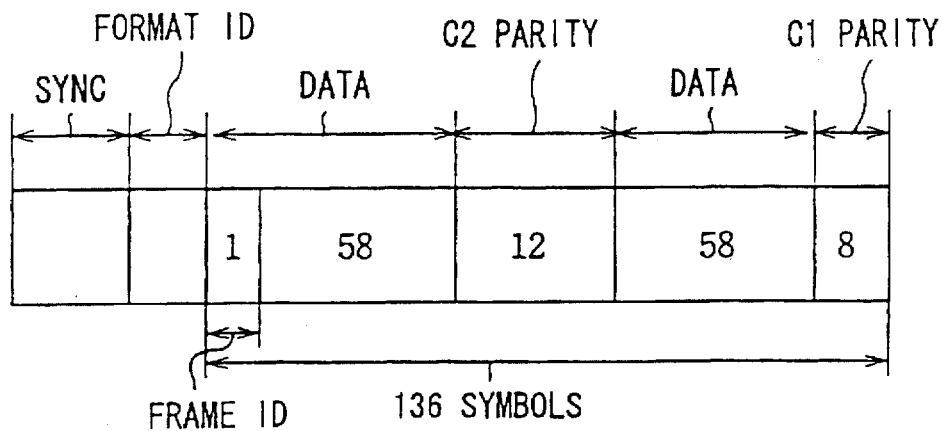
FIG. 1 is a schematic diagram showing a structure of one code length of a C1 code by a method for encoding and decoding a digital signal according to the present invention.

In a method for encoding a digital signal, FIG. 1 shows a C1 code as a whole wherein the code length comprises 136 symbols, data comprises 116 symbols, 8 symbols at the end constitute a center of C1 parity, and 12 symbols at the center constitute a C2 parity. At the head of the code, a sync for synchronization detection is arranged, and, for example, one bit long format ID is arranged following a sync. This format ID describes which is the format of the two, an L format or an S format. One code length of the C1 code is referred to as one frame hereinbelow. A frame ID is arranged in one symbol at the head of the data following the format ID. Here, the frame ID is included in the C1 code. Then an error can be corrected with the C1 code correction.

Figure 2:
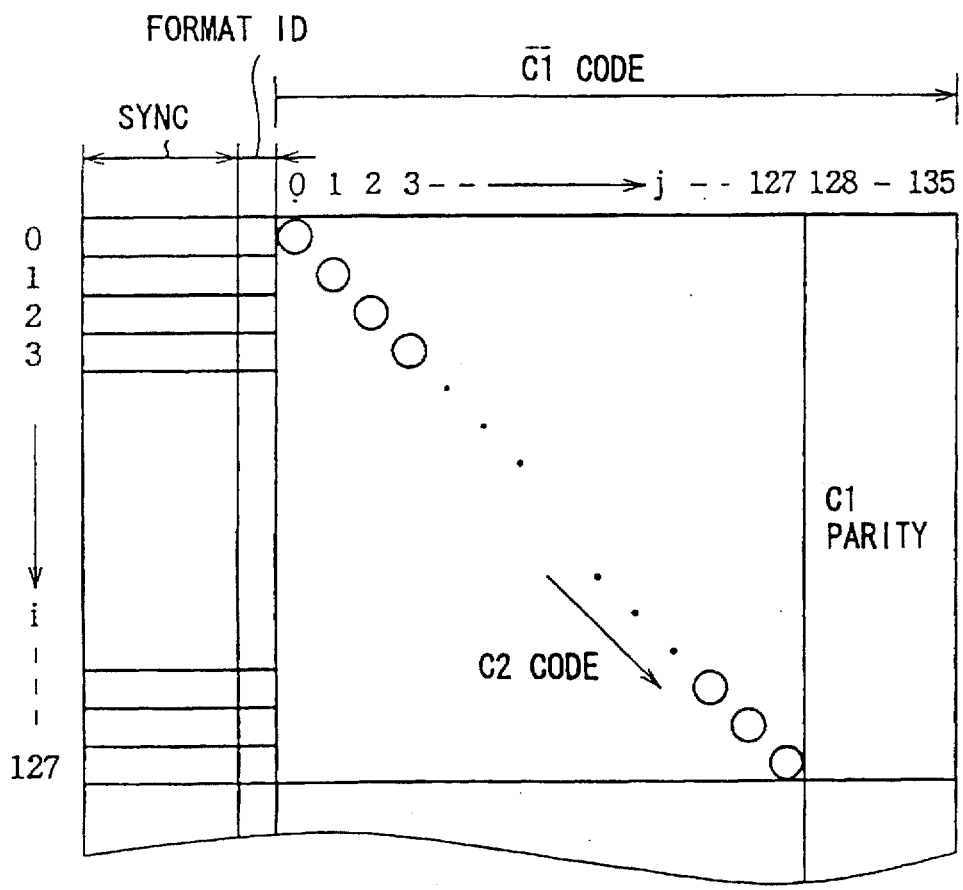
FIG. 2 is a schematic diagram explaining the interleave in an L format.

The interleave in the L format is shown in FIG. 2. In this L format, the C2 code has a code length of 128 symbols, and 128 symbols of C1 codes are interleaved. When an error is corrected by using a total parity symbol with the C2 code, an error in 12 symbols in the C2 code can be corrected. This corresponds to 12 C1 codes so that burst errors in 1632 symbols can be corrected.

Figure 3:
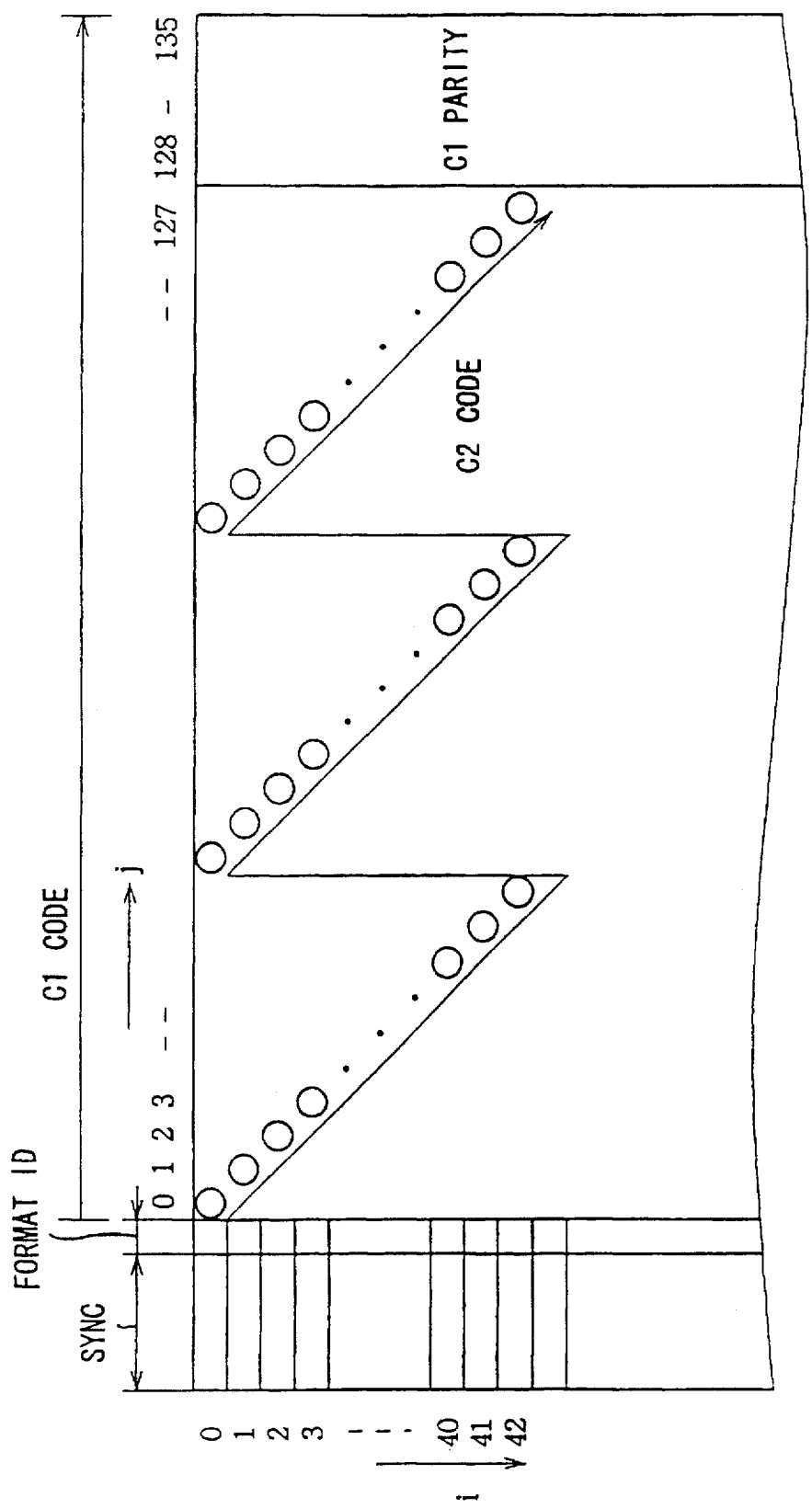
FIG. 3 is a schematic diagram explaining the interleave in an S format.

The interleave by the S format with respect to this point is shown in FIG. 3. The C1 code is completely the same as the L format. The C2 code has a code length of 128 symbols like the L format. The C2 code is interleaved that can be folded with the 43rd C1 code. The constraint length thereof is one third of the L format. When it is possible to correct an error in 12 symbols in the C2 code like the L format, the burst error in four portions of the C1 code, namely 544 symbols can be corrected.

The redundancy in this format is 14.7% as compared with 25% in the CD. In addition, in the CD, the codes C1 and C2 have a parity number of four symbols. However, in this format, the codes C1 and C2 have a parity number of 8 symbols and 12 symbols respectively. Since the codes are so-called LDC (Long Distance Code), the correction capability can be remarkably improved as compared with the CD.

Figure 4:
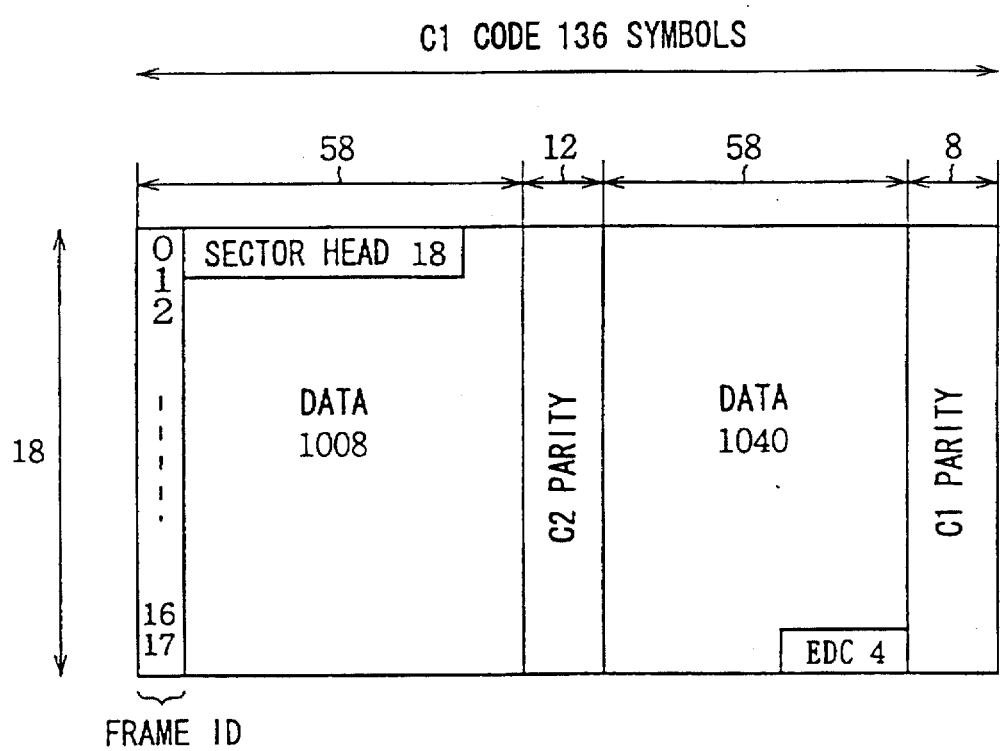
FIG. 4 is a schematic diagram explaining a sector structure by a method for encoding and decoding a digital signal according to the present invention.

A sector structure in this format is shown in FIG. 4. Eighteen C1 codes constitute one sector. A data portion excluding a parity comprises 2088 symbols. Out of 2088 symbols, the frame ID comprises 18 symbols, the sector head comprises 18 symbols, an error detection code (EDC) comprises 4 symbols. The remaining 2048 symbols constitute actual data. In other words, when one symbol comprises one byte, one sector comprises 2k bytes. Numbers are recorded in the frame ID in an order of 0, 1, 2, ..., 17 from the head frame of the sector. This is repeated for each of the sectors.

Figure 5A:
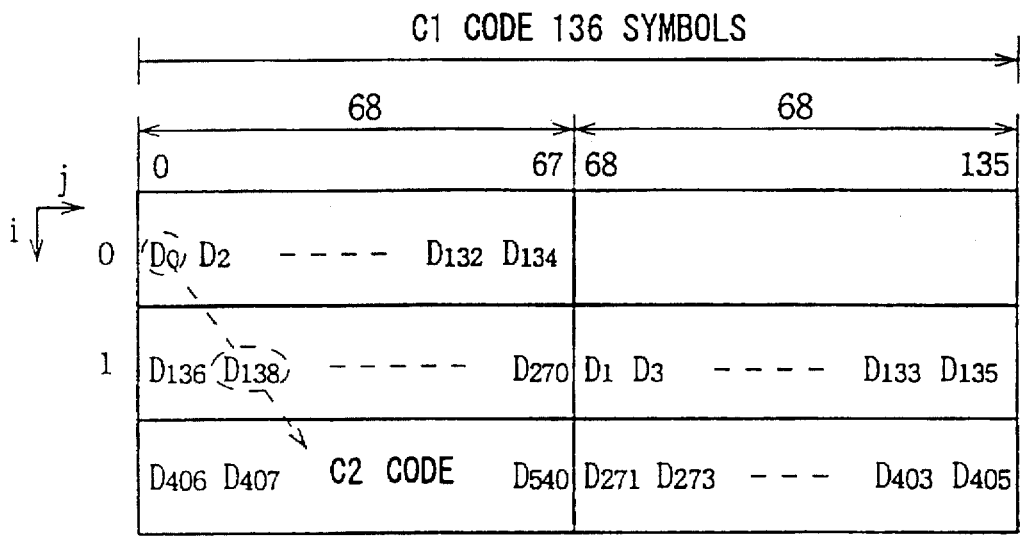
FIG. 5(A) and 5(B) are schematic diagrams showing a recording order on a disc and an order of a C1 code.

A case will be described in which odd-numbered symbol is delayed at the encoding time so that an arrangement of symbols in the C2 code series of the digital signal in this embodiment does not agree with a symbol arrangement on the disc. FIG. 5(A) shows a relation among the C1 code series, the C2 code series and data actually recorded on the disc according to the present embodiment. Data is read in the horizontal direction so that the C1 code is corrected. Like the aforementioned FIG. 19, the C1 code order is designated by symbol "i", a symbol order in the C1 code is designated by symbol "j", and a symbol on the disc is designated by "Dk". The symbols "i" and "j" are represented in the following equation:

$$i = (K/136) + (k \bmod 2)$$

$$j = 68 \cdot (k \bmod 2) + ((k \bmod 136)/2) \qquad (2)$$

Figure 6:
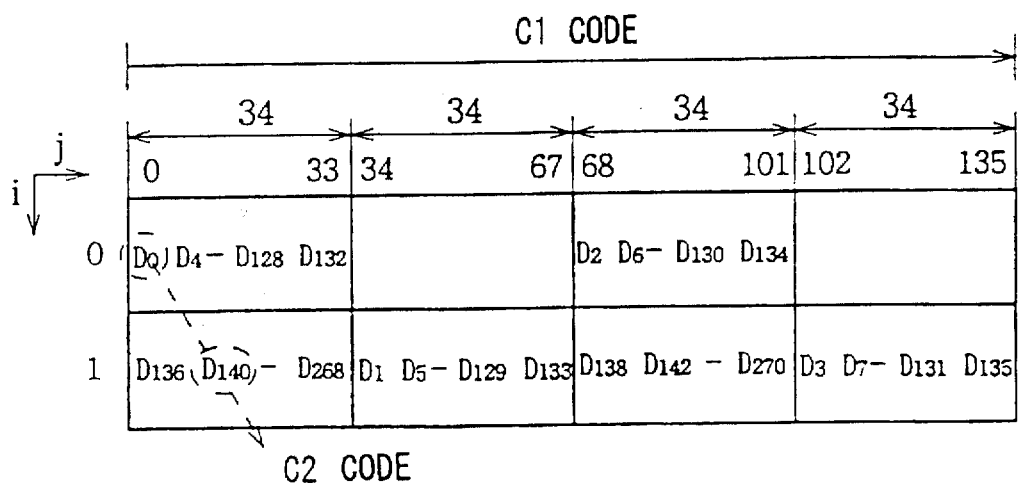
FIG. 6 is a schematic diagram showing a recording order on the disc and the order of the C1 code.

More specifically, odd-numbered symbol in which "k" is an even number is arranged in the first half of the C1 code whereas even-numbered symbol in which "k" is an odd number is arranged in the latter half of the subsequent C1 code. In such a delay, the data order on the disc does not agree with the data order of the C2 code so that the effect of the burst error can be minimized. Such a delay can be actualized by providing a delay portion 306 shown in FIG. 8 that will be described later. In this example, symbols are arranged by dividing into two the C1 code. However the division is not limited to two part division. For example, the code may be divided into four parts as shown in FIG. 6. In such a case, "i" and "j" are represented in the following equations:

$$i = (k/136) + (k \bmod 2)$$

$$j = 34 \cdot (k \bmod 4) + ((k \bmod 136)/4) \qquad (3)$$

In such an operation, it is possible to arrange the structure so that the data order on the disc does not agree with the C2 code order.

Figure 5B:
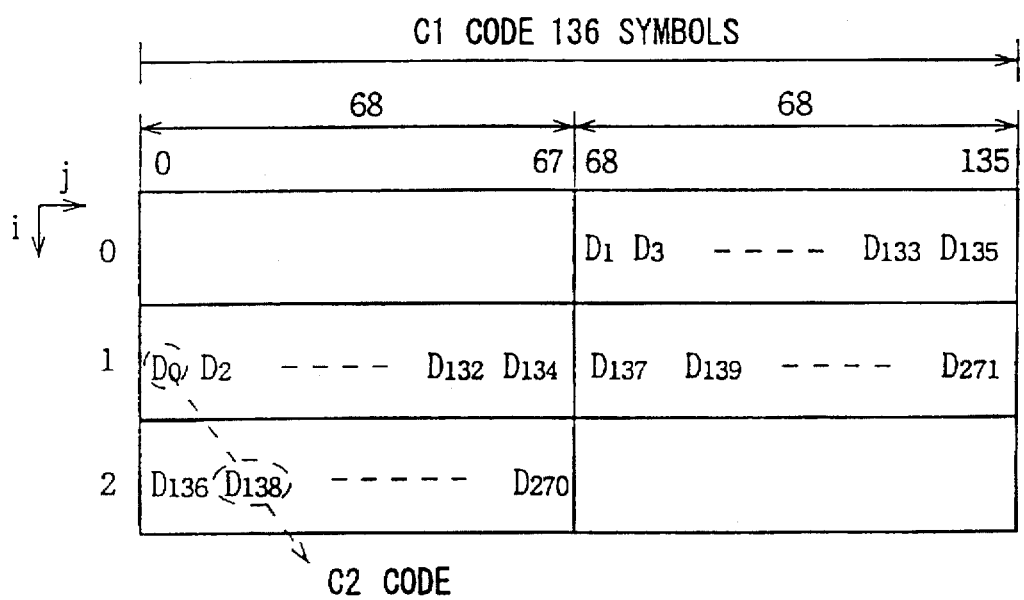

Furthermore, in FIG. 5(A), odd-numbered symbol is delayed, but even-numbered symbol may be delayed. Relations among the C1 code series, the C2 code series and data actually recorded on the disc is such that is shown in FIG. 5(B).

When odd-numbered symbol is delayed, as shown in FIG. 5(A), a portion remains in which adjacent symbols in the C2 code series agree with an arrangement of symbols on the disc (for example, D270 and D271). In the case of FIG. 5(B) in which even-numbered symbol is delayed, no such phenomenon is generated with the result that the error correction capability can be improved. Incidentally, with respect to a case shown in FIG. 5(B), (i, j) can be shown in the following equation:

$$i = (k/136) - (k \bmod 2) + 1$$

$$j = 68 \cdot (k \bmod 2) + ((k \bmod 136)/2) \qquad (4)$$

(2) Digital Signal Encoding Apparatus and Digital Signal Decoding Apparatus

Figure 7:
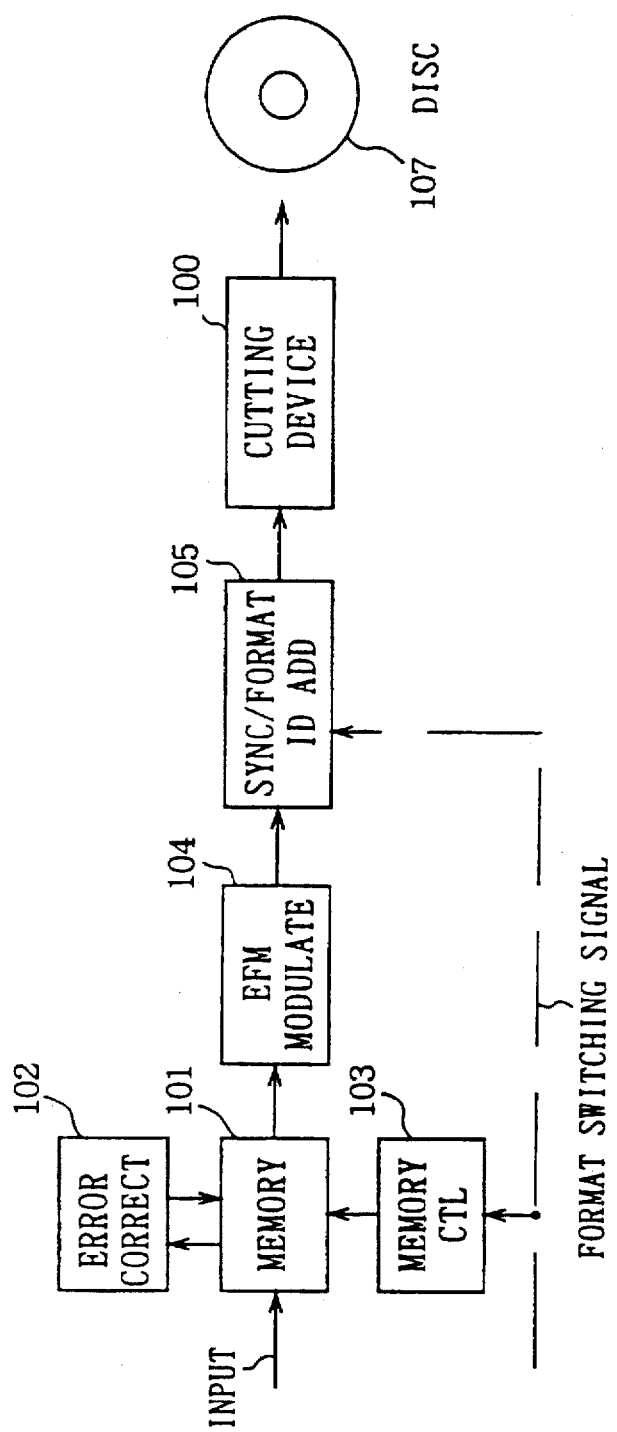
FIG. 7 is a block diagram showing a digital signal encoding apparatus according to one embodiment of the present invention.

There will be described an embodiment of a digital signal encoding apparatus for realizing a method for encoding the aforementioned digital signal and an embodiment of a digital signal decoding apparatus which corresponds to the digital signal encoding apparatus. In the beginning, a structure of the digital signal encoding apparatus according to the present invention is shown in FIG. 7. This digital signal encoding apparatus selects either the L format or the S format with a format switching signal. Data to which the frame ID is added to the head of the frame is input to input the format.

An input signal is input to a memory 101 in the beginning. Either C1 code or C2 code is sent to an error correction circuit 102 in this order and an error correction code is added thereto and is written into the memory 101 again. Then the code is sent to an EFM modulation circuit 104. The generation of a writing address and a reading address in these memories is controlled in accordance with the format selected with the format switching signal by the memory control portion 103.

Figure 8:
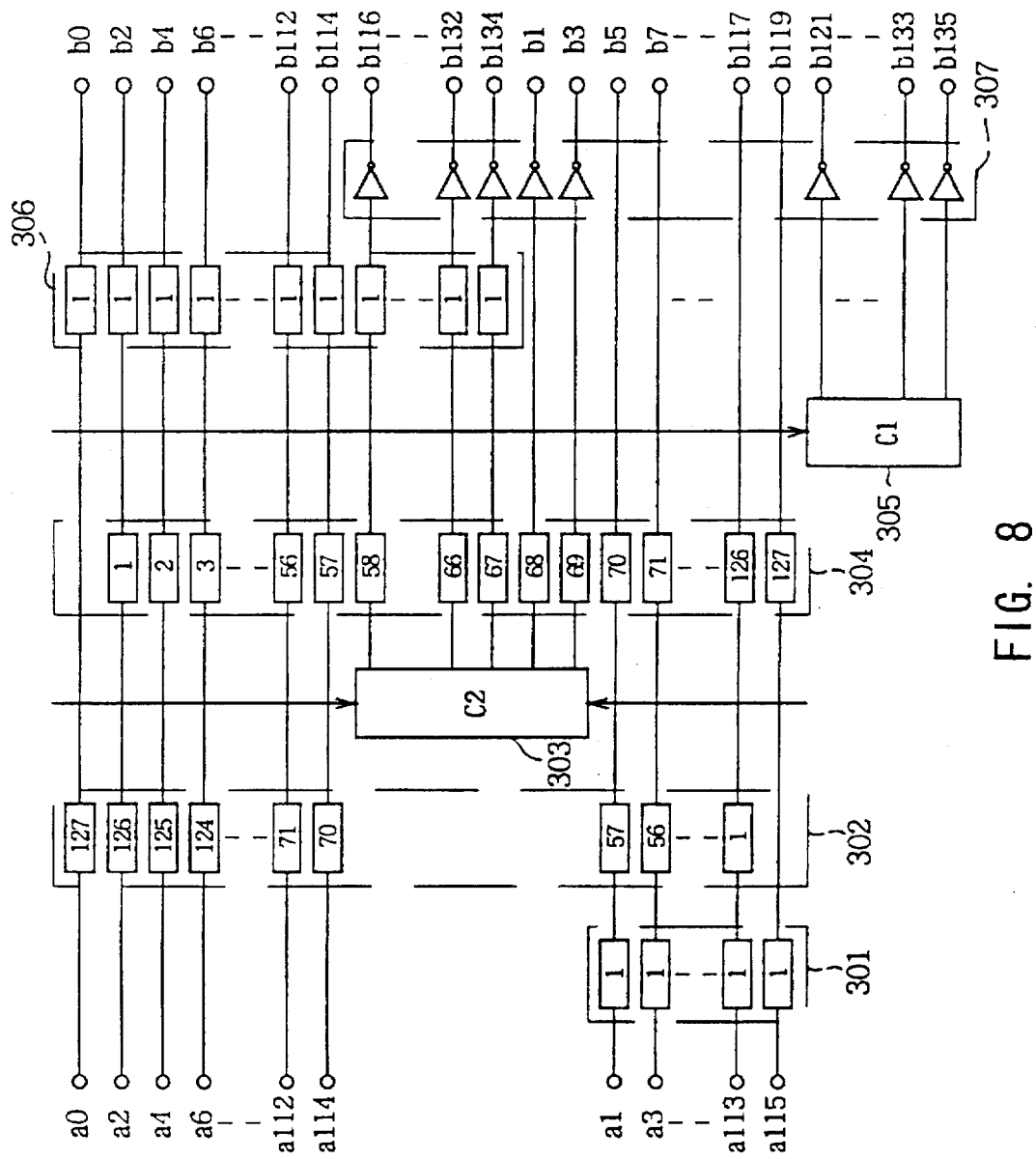
FIG. 8 is a block diagram showing a structure of an error correction code encoding process portion in the L format in the digital signal encoding apparatus of FIG. 7.

FIG. 8 shows a case in which input data is processed with the memory 101 and the error correction circuit 102 in the case of the L format of FIG. 5(A). The input data is processed in such a manner that 116 symbols from a0 to a115 are collected in one group. In the beginning, even-numbered symbol is delayed by one code length at the delay portion 301. Then the symbols are interleaved with an interleaver 302 so that the symbols are rearranged in an order of the C2 code shown in FIG. 2, and a C2 correction parity is calculated and added at the C2 code encoding portion 303.

Then after the symbols are brought back to the original order with a deinterleaver 304, and the C1 correction parity is calculated and added at the C1 code encoding portion 305, odd-numbered symbol is delayed at the delay portion 306. After that, only correction symbol parities of C1 and C2 codes are inverted at the inverter 307 so that 136 symbols from b0 to b135 are output. The symbols are recorded on the disc 107 in an order of b0, b1, b2, . . . Incidentally, the L format in FIG. 5(B) can be realized by providing the delay portion 306 on the side of b1, b3, b5 . . . b133, b135 instead of providing the same portion 306 on the side of b0, b2, b4 . . . b132, b134 in FIG. 8.

Figure 9:
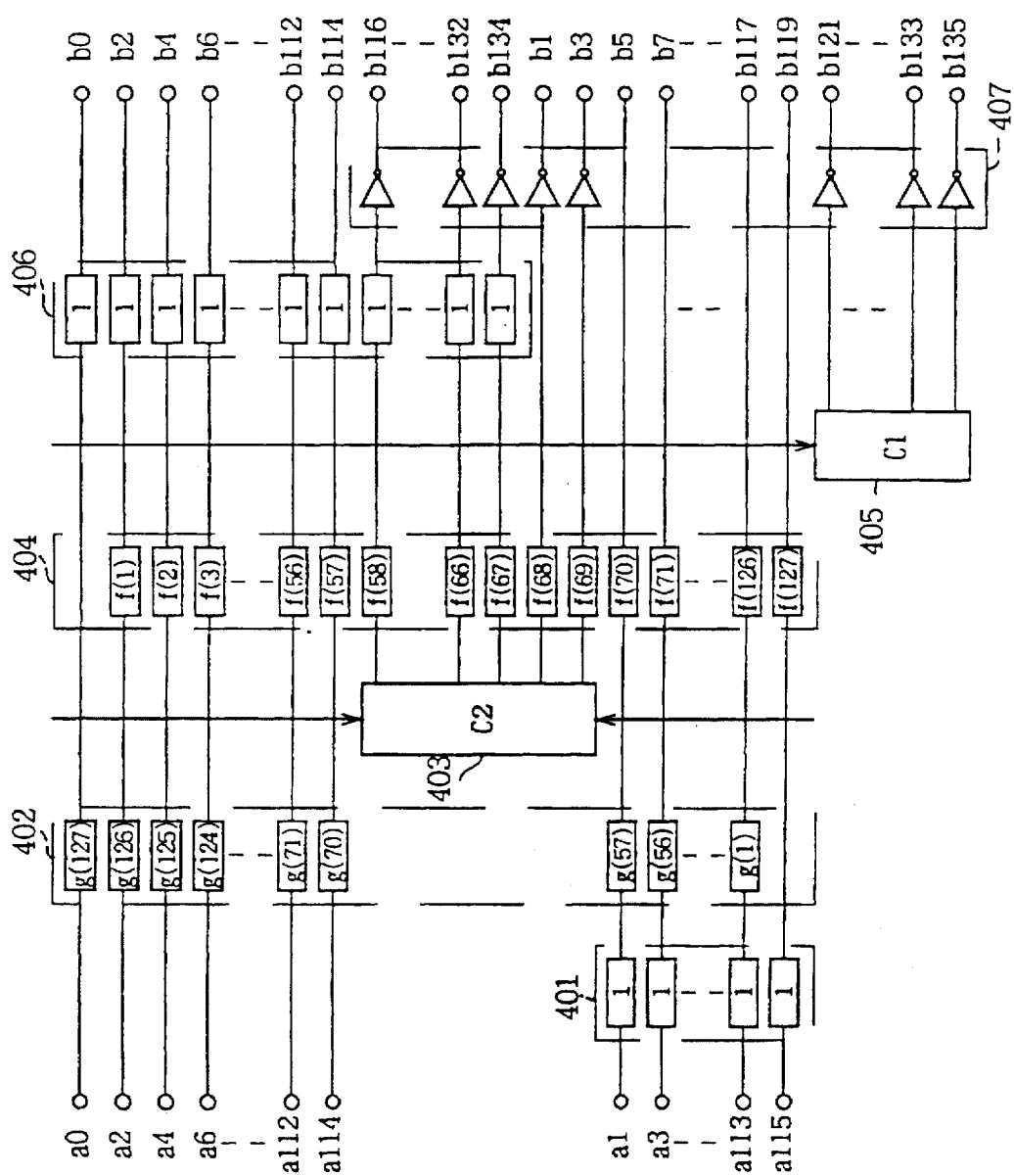
FIG. 9 is a block diagram showing a structure of an error correction code encoding process portion in the S format in the digital signal encoding apparatus of FIG. 7.

FIG. 9 shows a case of the S format like the aforementioned case. The case shown in FIG. 9 is different from the aforementioned case of the L format only in an interleaver 402 and a deinterleaver 404. A delay portion 401 has the same structure as the delay portion 301. A C2 code encoding portion 403 has the same structure as the C2 code encoding portion 303. A C1 code encoding portion 405 has the same structure as the C1 code encoding portion 305. A delay portion 406 has the same structure as the delay portion 306. An inverter 407 has the same structure as the inverter 307. A delay quantity g(x) of the interleaver 402 and a delay quantity f(x) of the deinterleaver 403 are represented in the following equations.

$f(x)=x \bmod 43$ $g(x)=42-f(127-x)$ (5)

This provides a C2 code order as shown in FIG. 3.

The data sent from the memory 101 to the EFM modulation circuit 104 is EFM modulated and the sync and the format ID of the selected format are added in the subsequent sync/format ID adding circuit 105. Then the data is sent to a cutting device 106 so that the disc 107 is manufactured.

Since the digital signal encoding method in the present embodiment is based on an assumption that the digital signal is used for recording and reproducing computer data, and compressed data or the like, it is considered that a portion where an error cannot be corrected is not extended to a wide scope when an error cannot be corrected. The C2 code is added via an interleaver so that data is recorded on a disc 107 in the original data order, namely in the order of a0 to a115. After that the data is brought back to the original order with the deinterleaver. Furthermore, a delay portion 301 is provided so that the delay quantity of the even number symbol becomes equal to the quantity of the odd number symbol.

The embodiment will be explained with respect to FIG. 8. The symbol a0 is delayed by 127 frames with the interleaver 302, and then is further delayed by one frame with the delay portion 306. Therefore, when the symbol a0 is output as b0, the data order is delayed by a total of 128 (=127+1) frames. Further, the data order a2 is delayed by 126 frames with the interleaver 302, and then is further delayed by one frame with the deinterleaver 304. The same symbol is still further delayed by one frame with the delay portion 306. Therefore, when the symbol a2 is output as b2, the symbol is delayed by a total of 128 (=126+1+1) frames. The same thing holds of other symbols such as a4, a6. . . . a112, and a114. The delay quantity of the odd-numbered symbol represented by an even number in FIG. 8 is 128 frame in respective cases.

On the other hand, the even-numbered symbol represented by an odd number in the FIG. 8 is delayed as follows. When the delay portion 301 is not provided, the symbol a1 is delayed by 57 frames with the interleaver 302. The symbol a1 is further delayed by 70 frames with the deinterleaver 304. Consequently, when the symbol a1 is output as b5, the same symbol is delayed by a total of 127 (=57+70) frames. Further, the symbol a3 is delayed by 56 frames with the interleaver 302. The symbol a3 is delayed by 71 frames with the deinterleaver 304. Consequently, when the symbol a3 is output as b7, the same symbol is delayed by a total of 127 (=56+71) frames. The same thing holds true of other symbols such as a5, a7 . . . a113, and a115. The delay quantity of even-numbered symbol is 127 frames in respective cases.

The difference in the delay quantity between the odd-numbered symbol and even-numbered symbol is one frame. To absorb this delay quantity, the delay portion 301 is provided. When the delay portion is constituted in such a manner, the original data order agrees with the data order recorded on the disc. Thus, an expansion of the portion that cannot be corrected can be prevented in comparison with the case that the original data order is shuffled like the CD.

However, the delay portion 301 may not be provided. In this case, the data order recorded on the disc agrees with the data order of the C1 code series. Although the data order recorded on the disc does not agree with the original data order completely, the original data order is maintained to a certain degree in comparison with the case that the original data order is shuffled like the CD. Thus, the expansion of the portion that cannot be corrected can be prevented. Incidentally it goes without saying that a delay portion 507 is not provided on the side of a decoder when the delay portion 301 is not provided on the side of an encoder.

Figure 10:
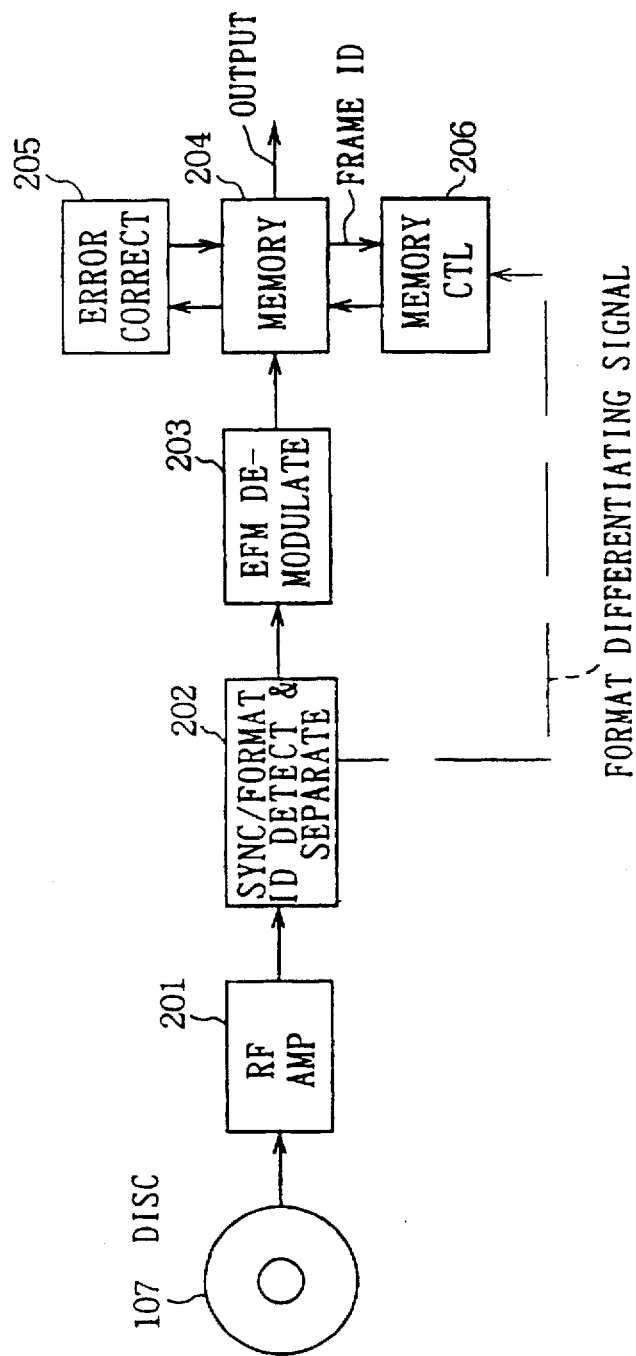
FIG. 10 is a block diagram showing a digital signal decoding apparatus according to one embodiment of the present invention.

On the other hand, the digital signal decoding apparatus is constituted as shown in FIG. 10. A signal read out from the disc 107 passes through an RF amplifier 201 to be detected and separated into a sync and format ID with a sync/format ID detecting and separating circuit 202. Then the signal is differentiated to determine whether the signal is in the L format or in the S format. Then a format differentiation signal is sent to a memory controller 206 on the rear column. The data deprived of the sync and the format ID at the sync/format ID detecting and separating circuit 202 is demodulated with the EFM demodulation circuit 203 and is incorporated into the memory 204.

The memory controller 206 detects whether the data is in the L format or in the S format with the format differentiation signal output from the sync/format ID detecting and separating circuit 202. In accordance with the detection, the memory controller 206 controls the writing and reading addresses of the memory. The data incorporated into the memory 204 is rearranged into an order of C1 codes and is sent to an error correction circuit 205. Then the corrected code is then written into the memory 204 again. The code that has been subjected to the C1 code correction is read out in the order of C2 code. The code is further corrected with the error correction circuit 205 in the same manner and is written into the memory 204 again. The data that has been subjected to the error correction is output from the memory 204. These controls are performed by the memory controller 206.

Figure 11:
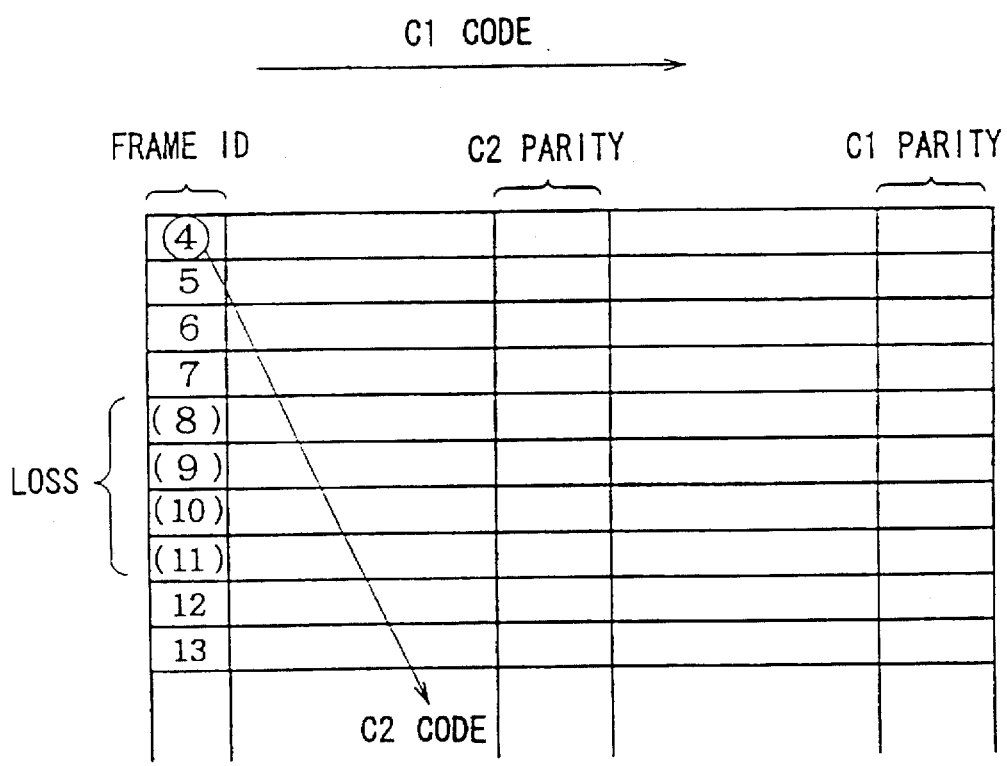
FIG. 11 is a schematic diagram explaining the burst error correction process.

Subsequently, countermeasures against a case in which consecutive number frames are lost in a burst error will be explained. When the code after the C1 code correction is written into the memory 204, the frame ID at the head of the code is output to the memory controller 206. The memory controller 206 monitors the continuity of the frame ID. FIG. 11 shows how the code after the C1 code correction is written into the memory 204. A frame having 1 as the frame ID is referred to as frame 1 hereinafter. Suppose that frames 4, 5, 6, and 7 are written into the memory and then the subsequent four frames are lost in the burst error so that the C1 code cannot be corrected and the same C1 code can be corrected again with the frame 12.

Here, when the frame 12 is written immediately after the frame 4 on the memory 204, C2 code is suspended for 4 symbols so that the code cannot be corrected. To prevent it, the following countermeasures is provided. That is, when a difference is calculated between the frame 7 immediately before the burst error and the frame 12 immediately after the burst error, it is possible to detect that the lost number of frames is 4 frames. The frame ID surrounded by a bracket in FIG. 11 represents the lost frames in the burst error.

Then four frame portions of a memory area is provided so the frame 12 will be written from the 5th frame. With such an operation, four symbols error can be generated and corrected on the C2 code. In this manner, the memory controller 20 constantly monitors the frame ID to appropriately switch the address to which the C1 code is written so that the C2 code can be corrected even if several frames are lost in the burst error.

Figure 12:
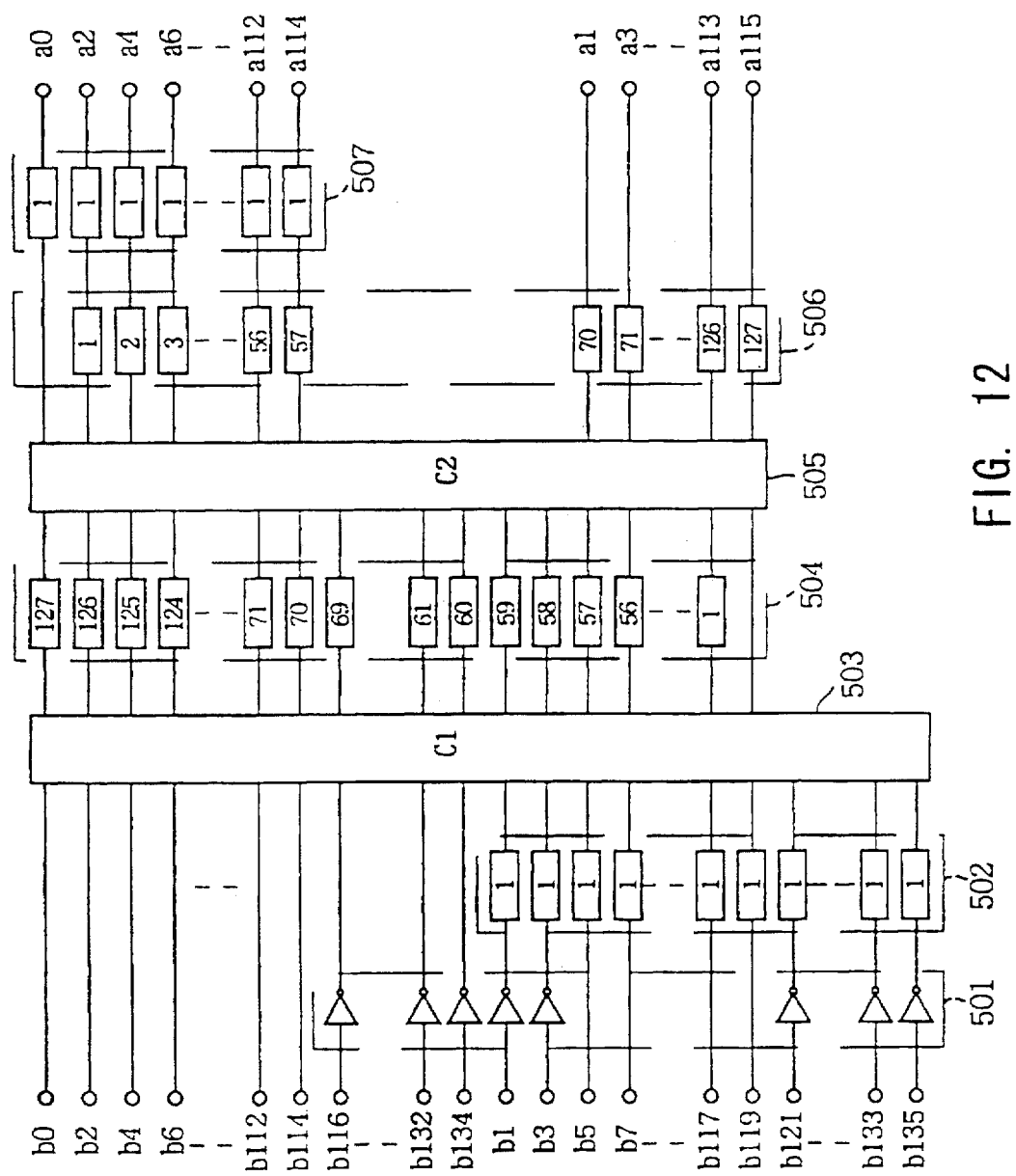
FIG. 12 is a block diagram showing a structure of an error correction code decoding process portion in the L format in the digital signal decoding apparatus of FIG. 10.

FIG. 12 shows a process in which data in the L format shown in FIG. 5(A) is processed at the memory 204 and the error correction circuit 205. With respect to the input data, 136 symbols from b0 to b135 are processed as one group. In the beginning, C1 and C2 parities are inverted with the inverter 501 and even-numbered symbol is delayed by a length of one code at the delay portion 502. After that, the C1 code is corrected at the C1 code decoding portion 503, and is interleaved with the interleaver 504. Then the C2 code is corrected at the C2 code decoding portion 505.

After this the code is deinterleaved with the deinterleaver 506. Then odd-numbered symbol is delayed by a length of one code with the delay portion 507 to provide outputs a0 to a115. Here the interleaver 504 is the same as the interleaver 302, and the deinterleaver 506 is the same as the deinterleaver 304. Incidentally, the L format shown in FIG. 5(B) can be realized by providing the delay portion 502 on the side of b0, b2, b4 ... b132 and b134 instead of providing the same portion on the side of b1, b3, b5 ... b133 and b135 in the FIG. 12.

Figure 13:
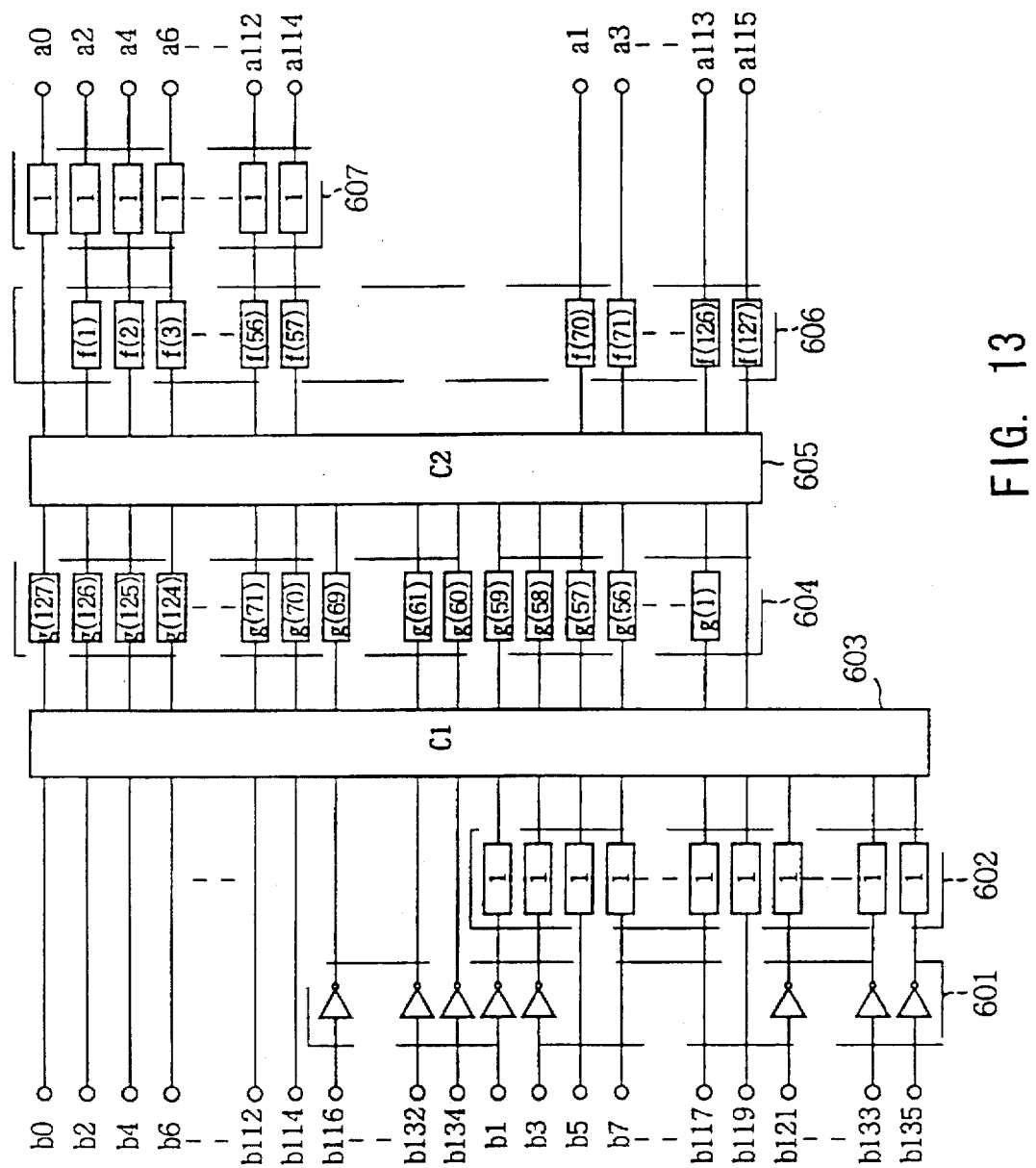
FIG. 13 is a block diagram showing a structure of an error correction code decoding process portion in the S format in the digital signal decoding apparatus of FIG. 10.
Figure 14:
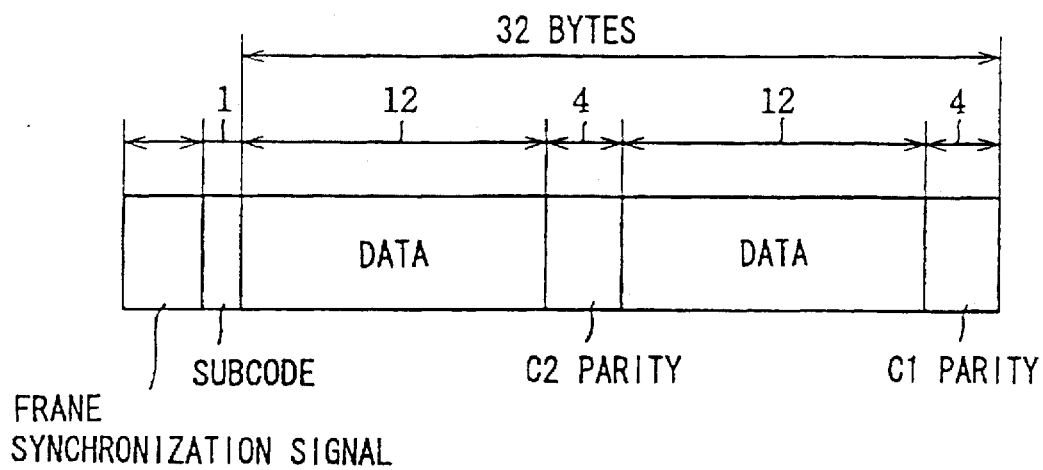
FIG. 14 is a schematic diagram showing a structure of one code length of the C1 code in the conventional compact disc.
Figure 15:
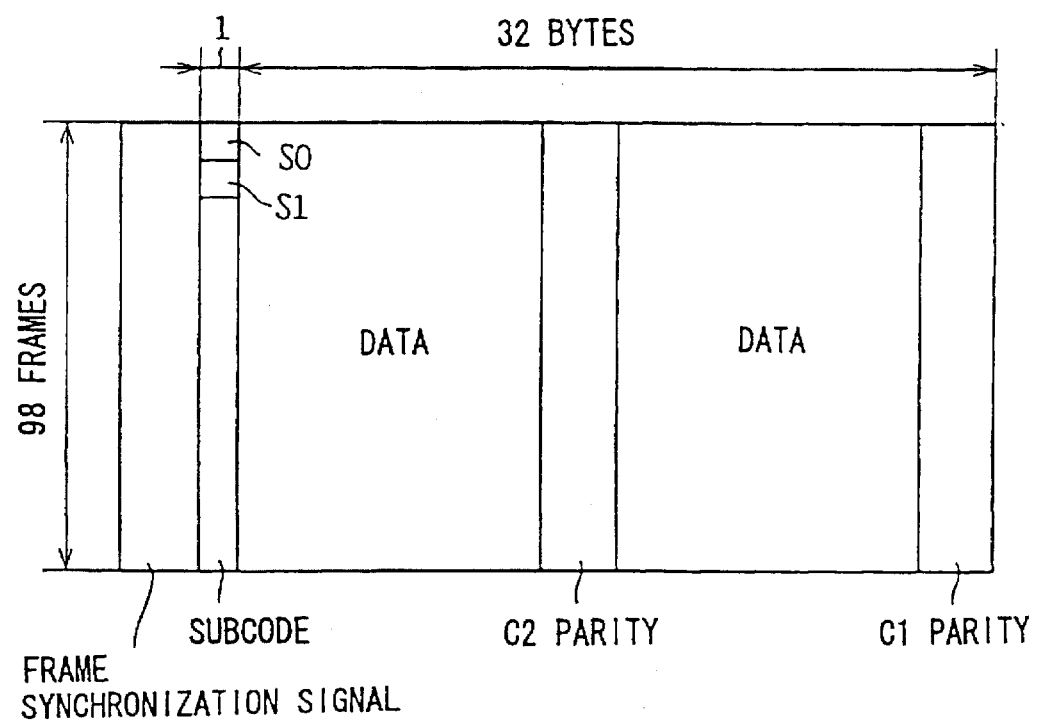
FIG. 15 is a schematic diagram showing a structure of a sector in the conventional compact disc.
Figure 16:
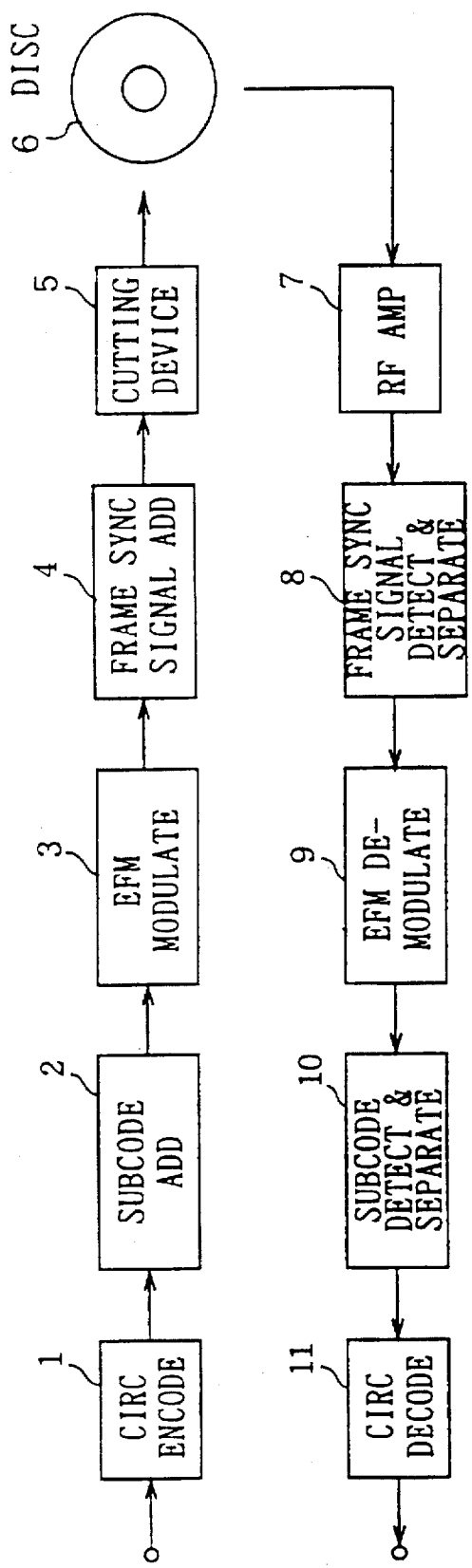
FIG. 16 is a block diagram showing an encoding and decoding apparatus of the conventional compact disc.
Figure 17:
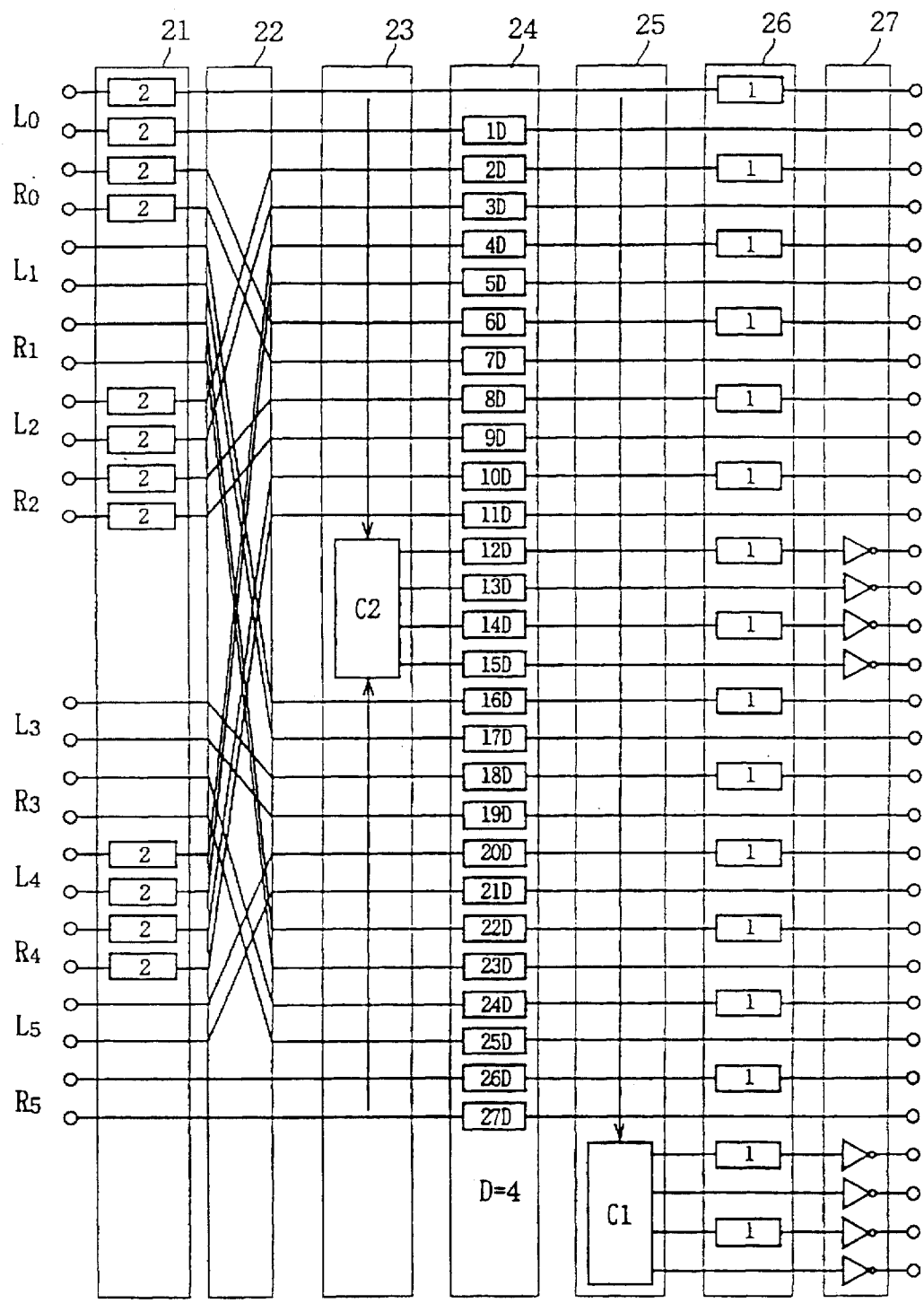
FIG. 17 is a block diagram showing a structure of an error correction code encoding process portion in the encoding apparatus of the conventional compact disc.
Figure 18:
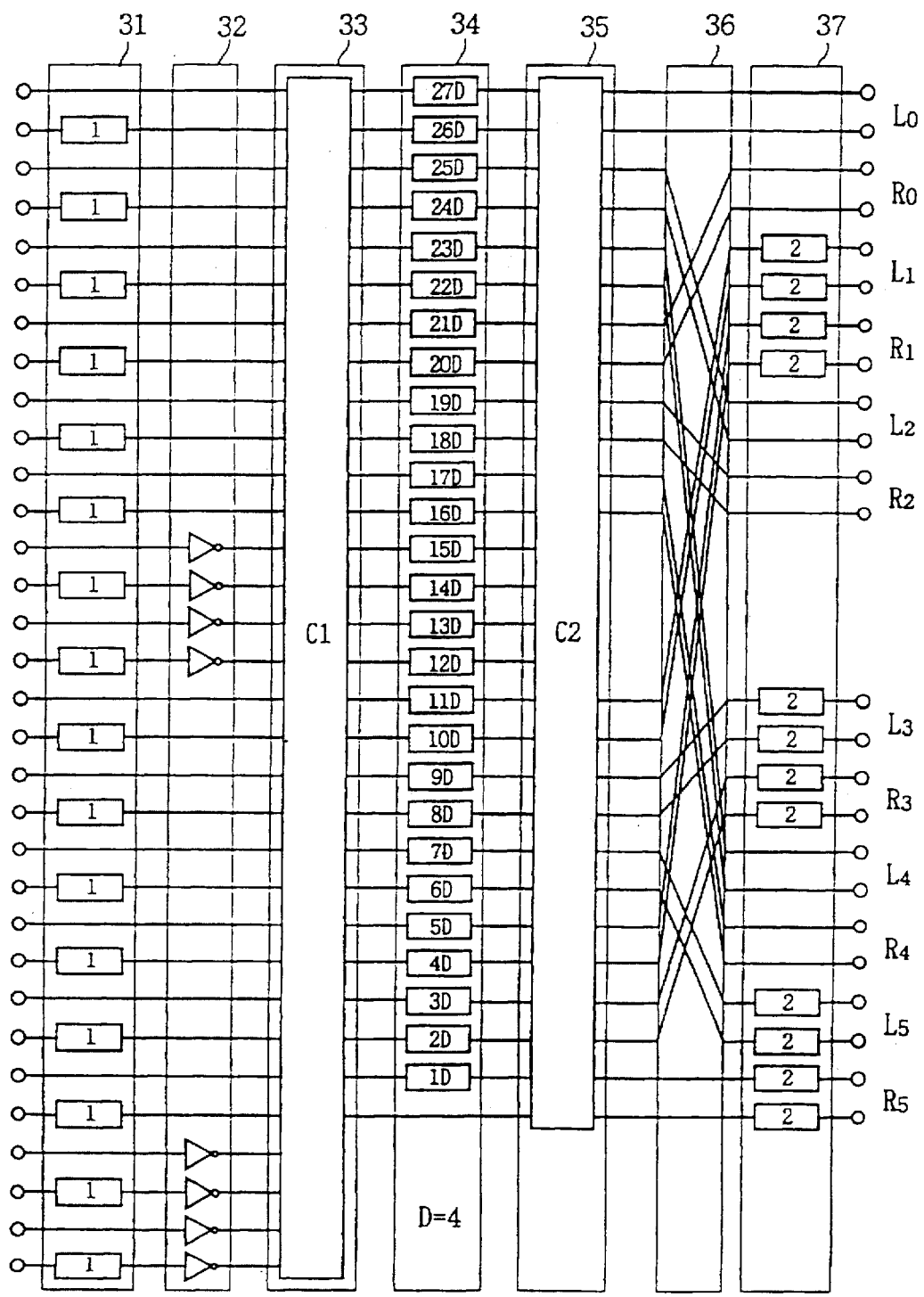
FIG. 18 is a block diagram showing a structure of an error correction code decoding process portion in the decoding apparatus of the conventional compact disc.

FIG. 13 shows a case of the S format in the same manner as the aforementioned case. The S format is different from the L format only in the interleaver 604 and the deinterleaver 606. The inverter 601 is the same as the inverter 501. The delay portion 602 is the same as the delay portion 502. The C1 code decoding portion 603 is the same as the C1 code decoding portion 503. The C2 code decoding portion 605 is the same as the C2 code decoding portion 505. The delay portion 607 is the same as the delay portion 507. In addition, the delay quantity g(x) of the interleaver 604 is the same as the counterpart of the interleaver 402. The delay quantity f(x) of the deinterleaver 606 is the same as the counterpart of the deinterleaver 404.

Incidentally, the process at each of the delay portions and interleavers shown in FIGS. 8 and 9 can actually be realized when the memory controller 103 controls the writing address, the reading address, the writing timing and the reading timing of the memory 101. In the same manner, the process at each of the delay portions and deinterleavers shown in FIGS. 12 and 13 can actually be realized when the memory controller 206 controls the writing address, the reading address, the writing timing and the reading timing of the memory 204. For example, when data D0, D2, D3 ... reproduced from the disc 107 is respectively stored in a position which corresponds to (i, j) shown in FIG. 5(A) as the writing address of the memory and is subsequently read out in the horizontal direction, namely when data D136, D138 ... D270, D1, D3 ... D133 and D135 which corresponds to i=1 is read out, even-numbered symbol in the delay portion 502 of FIG. 12 is delay processed. In addition, the switching of the L format and the S format can be realized by switching the control method of the memory controller 103 and the memory controller 206.

In the above structure, error correction capabilities can be remarkably improved with respect to the random error and the burst error by increasing the code length and the error correction parity number and lengthening the interleave constraint length as compared with the CD standard. Further, the quantity of data that can be recorded actually can be increased by reducing the redundancy as compared with the CD standard. Thus, when the digital signal is encoded and decoded by adding an error correction code, the error correction capabilities can be improved and the redundancy can be reduced with a simple structure.

Further, in the aforementioned structure, formats having the same code length and the same error correction parity number and different interleave constraint length are prepared so that those formats are differentiated with the format ID. Consequently, the aforementioned structure can correspond to a plurality of formats without complicating the encoding apparatus and the decoding apparatus. With the differentiation with the format ID, a plurality of formats can be mixed on one disc and can be recorded and reproduced.

Further, in the aforementioned structure, the delay quantity of the odd-numbered symbol and even-numbered symbol are devised so that the C2 code order does not agree with the data order on the disc thereby preventing the worsening of the burst error correcting capabilities. Further, by adding the frame ID, when consecutive several frames are lost in the burst error, the number of frames can be accurately detected so that an error in the C2 code can be corrected without any trouble.

(3) Other Embodiments

In the aforementioned embodiments, the length of C1 code, namely one frame length is set to 136 symbols, and C1 parity and C2 parity are set to 8 symbols and 12 symbols respectively. The interleave constraint length is set to 128 symbols. However, one frame length, the parity length and the interleave constraint length are not limited thereto. Those length can be selected in accordance with the necessary. For example, even if the interleave constraint length of the S format is the half length of the counterpart of the L format, the same effect as the aforementioned embodiments. Further, C1 parity is arranged at the end of the code and C2 parity is arranged at the center of the code in the aforementioned embodiments, but the arrangements are not limited thereto. The parities can be arranged everywhere of the code.

For example, in the L format, the length of C1 code, namely one frame length may be set to 170 symbols, and C1 parity and the C2 parity may be set to 8 symbols and 14 symbols respectively. The interleave constraint length can be set to 138 frames. The C1 parity and the C2 parity can be arranged at the end of the code.

Furthermore, in the aforementioned embodiment, the L format and the S format can be selected. A format ID for differentiating the selected format is provided, but the L format and the S format can independently exist. So a format in which either of the two is adopted at the outset is included in the scope of the present invention. Incidentally, the format ID is not required in this case.

In the aforementioned embodiment, there is described a case in which the format ID is added to one bit following the sync. The arrangement of the format ID is not limited thereto. For example, the format ID may be provided inside of the sector head. Further, the frame ID is set so that the frame ID is repeated cyclically in a unit of one sector. Instead of this, the frame ID can be repeated cyclic ally in a unit of several sectors. Alternatively, frames, for example, from 0 to 255 can be repeated irrespective of sectors.

In the aforementioned embodiment, there is described a case in which a read-only optical disc such as a compact disc or the like is presupposed as a recording medium of a digital signal. The present invention is not limited thereto. The present invention is preferably applied to digital signal encoding method and apparatus, a digital signal recording medium and digital signal decoding method and apparatus which use a writable medium such as magneto-optical discs, magnetic discs, or magnetic tapes.

As described above, the present invention provides digital signal encoding method and apparatus, a digital signal recording medium, and digital signal decoding method and apparatus which are capable of improving error correction capabilities with respect to random errors and burst errors and reducing the redundancy as compared with the CD standard to increase the quantity of data that can be actually recorded by increasing the code length and the error correction parity number and lengthening the interleave constraint length as compared with the CD standard.

Furthermore, the present invention provides digital signal encoding method and apparatus, a digital signal recording medium, and digital signal decoding method and apparatus which are capable of corresponding to a plurality of formats without complicating the encoding apparatus and the decoding apparatus by preparing formats having the same code length and correction parity number, and different interleave constraint length, differentiating the formats with the format ID and which are capable of mixing a plurality of formats into one medium to be recorded and reproduced by differentiating the formats with the format ID.

Furthermore, in accordance with the present invention, the burst error correcting capabilities are prevented from getting worse by arranging the apparatus so that the C2 code order does not agree with the data order on the disc by devising an odd number delay quantity. Furthermore, in accordance with the present invention, there is provided digital signal encoding method and apparatus, a digital signal recording medium and digital signal decoding method and apparatus which are capable of detecting the number of frames and correcting an error in the C2 code without any trouble even when several consecutive frames are lost in the burst error by adding the frame ID.

Industrial Applicability

The digital encoding method and apparatus of the present invention can be used for a DVD (digital video disc) recording apparatus. In addition, the digital signal decoding method and apparatus of the present invention can be used for the DVD reproducing apparatus. Further, the digital recording medium of the present invention can be used as the DVD.

We claim:

1. A digital signal encoding method for encoding a digital signal by adding an error correction code thereto, said method comprising the steps of:

interleaving samples of an input digital signal to generate an interleaved input digital signal;

adding to said interleaved input digital signal a first parity to generate a modified interleaved signal, said first parity being obtained by using at least a first code series of said interleaved input digital signal;

deinterleaving said modified interleaved signal to generate an intermediate signal;

adding to said intermediate signal a second parity obtained by using a second code series which corresponds to a plurality of symbols taken out from said plurality of adjacent first code series by shifting the symbols by one symbol; and arranging said input digital signal to which said first and said second parity are added so that an arrangement of said second code series symbols does not correspond to the sequence of symbols as recorded on a recording medium.

2. The digital signal encoding method according to claim 1 wherein a code length of said first and second code series, said first parity, said second parity and an interleave constraint length are respectively longer than the compact disc standard.

3. The digital signal encoding method according to claim 1 wherein said second code series excludes a folding with respect to a predetermined number of said first code series.

4. The digital signal encoding method according to claim 1 wherein said second code series includes a folding with respect to a predetermined number of said first code series.

5. The digital signal encoding method according to claim 1 wherein:

one format is selected from a plurality of formats having the same code length and parity length and different interleave constraint length; and identification information for identifying said selected format is encoded.

6. The digital signal encoding method according to claim 1 wherein an identification number is added to said each of first code series.

7. A digital signal encoding apparatus for encoding a digital signal by adding an error correction code thereto, said apparatus comprising:

means for interleaving samples of an input digital signal to generate an interleaved input digital signal;

means for adding to said interleaved input digital signal a first parity to generate a modified interleaved signal, said first parity being obtained by using at least a first code series of said interleaved input digital signal;

means for deinterleaving said modified interleaved signal to generate an intermediate signal;

means for adding to said intermediate signal a second parity obtained by using a second code series which corresponds to a plurality of symbols taken out from said plurality of adjacent first code series by shifting the symbols by one symbol; and means for arranging said input digital signal to which said first and said second parity are added so that an arrangement of said second code series symbols does not correspond to the sequence of symbols as recorded on a recording medium.

8. The digital signal encoding apparatus according to claim 7 wherein a code length of said first and second code series, said first parity, said second parity and an interleave constraint length are respectively longer than the compact disc standard.

9. The digital signal encoding apparatus according to claim 7 wherein said second code series includes a folding with respect to a predetermined number of said first code series.

10. The digital signal encoding apparatus according to claim 7 wherein said second code series excludes a folding with respect to a predetermined number of said first code series.

11. The digital signal encoding apparatus according to claim 7 wherein the apparatus has means for encoding identification information for identifying the format selected from a plurality of formats having the same code length and parity length and different interleave constraint length.

12. The digital signal encoding apparatus according to claim 7 wherein the apparatus has means for adding an identification number to said each first code series respectively.

13. A digital signal recording medium on which an encoded digital signal is recorded, said encoded digital signal being generated by:

interleaving samples of an input digital signal to generate an interleaved input digital signal;

adding to said interleaved input digital signal a first parity to generate a modified interleaved signal, said first parity being obtained by using at least a first code series of said interleaved input digital signal;

deinterleaving said modified interleaved signal to generate an intermediate signal;

adding to said intermediate signal a second parity obtained by using a second code series which corresponds to a plurality of symbols taken out from said plurality of adjacent first code series by shifting the symbols by one symbol; and arranging said input digital signal to which said first and said second parity are added so that an arrangement of said second code series symbols does not correspond to the sequence of symbols as recorded on said digital signal recording medium.

14. The digital signal recording medium according to claim 13 wherein the code length of said first code series, said first parity, said second parity and the interleave constraint length are respectively longer than the compact disc standard.

15. The digital signal recording medium according to claim 13 wherein said second code series excludes a folding with respect to a predetermined number of said first code series.

16. The digital signal recording medium according to claim 13 wherein said second code series includes a folding with respect to a predetermined number of said first code series.

17. The digital signal recording medium according to claim 13 wherein identification information is recorded for differentiating a format selected from a plurality of formats having the same code length and correction parity and a different interleave constraint length.

18. The digital signal recording medium according to claim 13 wherein an identification number is added to each of said first code series.

19. A digital signal decoding method for decoding an encoded digital signal, said encoded digital signal having been generated by:

interleaving samples of an input digital signal to generate an interleaved input digital signal;

adding to said interleaved input digital signal a first parity to generate a modified interleaved signal, said first parity being obtained by using at least a first code series of said interleaved input digital signal;

deinterleaving said modified interleaved signal to generate an intermediate signal;

adding to said intermediate signal a second parity obtained by using a second code series which corresponds to a plurality of symbols taken out from said plurality of adjacent first code series by shifting the symbols by one symbol; and arranging said input digital signal to which said first and said second parity are added so that an arrangement of said second code series symbols does not correspond to the sequence of symbols as recorded on a recording medium, said method comprising the steps of:

subjecting said encoded digital signal to a first error correction in a direction of said second code series by using said second parity to generate a first corrected signal;

interleaving samples of said first corrected signal to generate an interleaved corrected signal;

subjecting said interleaved corrected signal to a second error correction in a direction of said first code series by using said first parity to generate a second corrected signal; and deinterleaving said second corrected signal to generate a decoded signal.

20. The digital signal decoding method according to claim 19 wherein the code length of said first and second code series, said first parity, said second parity and the interleave constraint length is longer than the compact disc standard respectively.

21. The digital signal decoding method according to claim 19 wherein said second code series excludes a folding with respect to a predetermined number of said first code series.

22. The digital signal decoding method according to claim 19 wherein said second code series includes a folding with respect to a predetermined number of said first code series.

23. The digital signal decoding method according to claim 19 wherein identification information is detected for differentiating a format selected from a plurality of formats having the same code length and parity length and different interleave constraint length, and error correction process is controlled on the basis of said identification information.

24. The digital signal decoding method according to claim 19 wherein an identification number added to said first code series respectively is detected and an error correction process is controlled on the basis of said identification number.

25. A digital signal decoding apparatus for decoding an encoded digital signal, said encoded digital signal having been generated by:

interleaving samples of an input digital signal to generate an interleaved input digital signal;

adding to said interleaved input digital signal a first parity to generate a modified interleaved signal, said first parity being obtained by using at least a first code series of said interleaved input digital signal;

deinterleaving said modified interleaved signal to generate an intermediate signal;

adding to said intermediate signal a second parity obtained by using a second code series which corresponds to a plurality of symbols taken out from said plurality of adjacent first code series by shifting the symbols by one symbol; and arranging said input digital signal to which said first and said second parity are added so that an arrangement of said second code series symbols does not correspond to the sequence of symbols as recorded on a recording medium, said apparatus comprising:

means for subjecting said encoded digital signal to a first error correction in a direction of said second code series by using said second parity to generate a first corrected signal;

means for interleaving samples of said first corrected signal to generate an interleaved corrected signal;

means for subjecting said interleaved corrected signal to a second error correction in a direction of said first code series by using said first parity to generate a second corrected signal; and means for deinterleaving said second corrected signal to generate a decoded signal.

26. The digital signal decoding apparatus according to claim 25 wherein the code length of said first and second code series, said first parity, said second parity and the interleave constraint length are respectively longer than the compact disc standard.

27. The digital signal decoding apparatus according to claim 25 wherein said second code series excludes a folding with respect to a predetermined number of said first code series.

28. The digital signal decoding apparatus according to claim 25 wherein
said second code series includes a folding with respect to a predetermined number of said first code series.

29. The digital signal decoding apparatus according to claim 25 comprising:
means for detecting identification information for differentiating a format selected from a plurality of formats having the same code length and parity length and a different interleave constraint length; and
means for controlling an error correction process on the basis of said identification information.

30. The digital signal decoding apparatus according to claim 25 comprising:
means for detecting an identification number added respectively to said first code series; and
means for controlling an error correction process on the basis of said identification number.

31. A digital signal encoding method for encoding a digital signal by adding an error correction code thereto, said method comprising the steps of:
adding to an input digital signal a first parity obtained by using at least a first code series of the input digital signal;
adding to said input digital signal a second parity obtained by using a second code series which corresponds to a plurality of symbols taken out from said plurality of adjacent first code series by shifting the symbols by one symbol; and
arranging said input digital signal to which said first and said second parity are added so that an arrangement of said second code series symbols does not correspond to the sequence of symbols as recorded on a recording medium;
wherein a code length of said first and second code series, said first parity, said second parity and an interleave constraint length are respectively longer than the compact disc standard.

32. The digital signal encoding method according to claim 31, wherein said second code series excludes a folding with respect to a predetermined number of said first code series.

33. The digital signal encoding method according to claim 31, wherein an identification number is added to said each of first code series.

34. A digital signal encoding apparatus for encoding a digital signal by adding an error correction code thereto, said apparatus comprising:
means for adding to an input digital signal a first parity obtained by using at least a first code series of the input digital signal;
means for adding to said input digital signal a second parity obtained by using a second code series which corresponds to a plurality of symbols taken out from said plurality of adjacent first code series by shifting the symbols by one symbol; and
means for arranging said input digital signal to which said first and second parities are added so that an arrangement of symbols in said second code series does not correspond to the sequence of symbols as recorded on a recording medium;
wherein a code length of said first and second code series, said first parity, said second parity and an interleave constraint length are respectively longer than the compact disc standard.

35. The digital signal encoding apparatus according to claim 34, wherein said second code series excludes a folding with respect to a predetermined number of said first code series.

36. The digital signal encoding apparatus according to claim 34, wherein the apparatus has means for adding an identification number to said each first code series respectively.

37. A digital signal recording medium in which encoding digital signal encoded by adding an error correction code is recorded, said encoding digital signal is generated by; adding to an input digital signal a first parity obtained by using at least a first code series of the input digital signal;
adding to said input digital signal a second parity obtained by using a second code series which corresponds to a plurality of symbols taken out from said plurality of adjacent first code series by shifting the symbols by one symbol; and
arranging said input digital signal to which said first and said second parity are added so that an arrangement of said second code series symbols does not correspond to the sequence of symbols as recorded on said digital signal recording medium;
wherein the code length of said first code series, said first parity, said second parity and the interleave constraint length are respectively longer than the compact disc standard.

38. The digital signal recording medium according to claim 37, wherein said second code series excludes a folding with respect to a predetermined number of said first code series.

39. The digital signal recording medium according to claim 37, wherein an identification number is added to each of said first code series.

40. A digital signal decoding method for decoding an encoding digital signal generated by adding to an input digital signal a first parity obtained by using at least a first code series of the input digital signal, adding to said input digital signal a second parity obtained by using a second code series which corresponds to a plurality of symbols taken out from said plurality of adjacent first code series by shifting the symbols by one symbol, and arranging the said input digital signal to which said first and second parities are added so that an arrangement of symbols of said second code series does not correspond to the sequence of symbols as recorded on a recording medium, said method comprising the steps of:
rearranging an encoding digital signal supplied from a transmission channel;
subjecting said rearranged encoding digital signal to a first error correction in a direction of said second code series by using said second parity; and
subjecting said rearranged encoding digital signal to a second error correction in a direction of said first code series by using said first parity;
wherein the code length of said first and second code series, said first parity, said second parity and the interleave constraint length is longer than the compact disc standard respectively.

41. The digital signal decoding method according to claim 40, wherein said second code series excludes a folding with respect to a predetermined number of said first code series.

42. The digital signal decoding method according to claim 40, wherein an identification number added to said first code series respectively is detected and an error correction process is controlled on the basis of said identification number.

43. A digital signal decoding apparatus for decoding an encoding digital signal generated by adding to an input digital signal a first parity obtained by using at least a first code series of the input digital signal, adding to said input digital signal a second parity obtained by using a second code series which corresponds to a plurality of symbols taken out from said plurality of adjacent first code series by shifting the symbols by one symbol, and arranging said input digital signal to which said first and second parities are added so that an arrangement of symbols of said second code series does not correspond to the sequence of symbols as recorded on a recording medium, said apparatus comprising:

means for rearranging an encoding digital signal supplied from a transmission channel;

means for subjecting said rearranging encoding digital signal to a first error correction in a direction of said second code series by using said second parity; and means for subjecting said rearranged encoding digital signal to a second error correction in a direction of said first code series by using said first parity;

wherein the code length of said first and second code series, said first parity, said second parity and the interleave constraint length are respectively longer than the compact disc standard.

44. The digital signal decoding apparatus according to claim 43, wherein said second code series excludes a folding with respect to a predetermined number of said first code series.

45. The digital signal decoding apparatus according to claim 43, further comprising:

means for detecting an identification number added respectively to said first code series; and means for controlling an error correction process on the basis of said identification number.

* * * * *